United States Patent [19]
Tsao et al.

[11] Patent Number: 5,621,736
[45] Date of Patent: Apr. 15, 1997

[54] FORMATTING OF A MEMORY HAVING DEFECTIVE CELLS

[75] Inventors: Lu-Wei Tsao; Lung-Yuh Liu; Hong-Long Lin, all of Hsinchu, Taiwan

[73] Assignee: Winbond Electronics Corp., Hsinchu, Taiwan

[21] Appl. No.: 420,868

[22] Filed: Apr. 12, 1995

[51] Int. Cl.⁶ ................................................ G06F 11/00
[52] U.S. Cl. ........................ 371/2.1; 365/201; 371/21.2
[58] Field of Search ............................. 371/2.1, 2.2, 40.1, 371/21.1, 21.6, 21.2, 40.2, 40.4; 395/182.06, 500, 481; 369/53, 44.26, 27, 65, 275.3, 57; 360/53, 49; 365/200, 201

[56] References Cited

U.S. PATENT DOCUMENTS

| | | | |
|---|---|---|---|
| 4,195,770 | 4/1980 | Benton et al. | 371/21.2 |
| 4,268,905 | 5/1981 | Johann et al. | 395/500 |
| 4,811,124 | 3/1989 | Dujari et al. | 360/49 |
| 4,821,254 | 4/1989 | Satoh et al. | 369/54 |
| 4,823,212 | 4/1989 | Knowles et al. | 360/77.08 |
| 5,200,959 | 4/1993 | Gross et al. | 371/21.6 |
| 5,404,357 | 4/1995 | Ito et al. | 371/21.2 |
| 5,459,742 | 10/1995 | Cassidy et al. | 371/40.1 |

Primary Examiner—Robert W. Beausoliel, Jr.
Assistant Examiner—Phung My Chung
Attorney, Agent, or Firm—Fish & Richardson P.C.

[57] ABSTRACT

The method provided first partitions the memory, which has defective cells at unknown locations, into a plurality of frames. Each of the plurality of frames has a corresponding N-bit of cell, and M-bit of cell for storing an index representative of the defectiveness of the (M+N)-bit cell. Secondly, the method performs a predetermined pattern write-read access test to the corresponding (M+N)-bit cell for each frame to determine if the (M+N)-bit of cell is defective. Thirdly, the method stores a first value of the index into the corresponding M-bit of cell for each frame, if the (M+N)-bit cell is good. Fourthly, the method stores a second value of the index into the corresponding M-bit of cell, if the (M+N)-bit cell is defective.

7 Claims, 3 Drawing Sheets

5,621,736

FORMATTING OF A MEMORY HAVING DEFECTIVE CELLS

TECHNICAL FIELD OF INVENTION

The invention relates to a formatting method of a memory and, in particular, of a memory having defective cells.

BACKGROUND OF INVENTION

In some electronic apparatus, e.g. digital answering machine, stringent requirement for a non-defective memory device used to store the voice data, either the answering information or the incoming information, is not necessary. Therefore, the Dynamic Random Access Memory (DRAM), Static Random Access Memory (SRAM), EEPROM or Flash memory, having defective cells at unknown locations and being not acceptable in other applications, is used in some audio applications and is known as Audio Grade RAM (ARAM).

It is well known that a data compression/decompression technique is generally employed in most audio data processing, which involves mass amount of data, to handle the data more efficiently. However, when ARAM is employed together with the data compression/decompression technique in the digital audio apparatus, the voice data obtained from the data decompression procedure may be over-distorted such that the output may not well identified by the human beings. Accordingly, an algorithm is required to assure the original data are stored within the non-defective cells of an ARAM.

One conventional approach is to record the address of the defective cells during the power-on period of the system into the a predetermined range of cells of the memory. And all access operations avoid the recorded addresses by the information stored in this predetermined range. However, this approach requires non-defective cells at the predetermined range of locations. This approach indirectly places a requirement of a sorting procedure on the ARAMs to assure all ARAMs used are non-defective at the predetermined range of locations.

Another conventional approach uses the concept of the FORMAT command in Disk Operating System (DOS) supplied by Microsoft Co.. This approach first partitions the memory into a plurality of good sectors and the data are stored in several good sectors. Each sector is linked to next associated sector by the linking address stored at the end of each sector. The defective cells are therefore circumvented.

Still another approach uses error correction algorithm and a corresponding check bit to correct any incorrect bit obtained from the defective memory. However, this approach requires associated hardware circuit and the cost thereof are elevated.

Therefore, it is the object of the invention to provide a less complicated and less expensive way to use a memory device having defective memory cells.

SUMMARY OF THE INVENTION

A method is provided to format a memory having defective cells at unknown addresses.

The method first partitions the memory into a plurality of frames. Each of the plurality of frames has a corresponding N-bit of cell, and M-bit of cell for storing an index representative of the defectiveness of the (M+N)-bit cell.

Secondly, the method performs a predetermined pattern write-read access test to the corresponding (M+N)-bit cell for each frame to determine if the (M+N)-bit cell is defective.

Thirdly, the method stores a GOOD value of the index into the corresponding M-bit of cell for each frame, if all (M+N)-bit cell are good.

Fourthly, the method stores a BAD value of the index into the corresponding M-bit of cell, if the (M+N)-bit cell is defective.

DETAILED DESCRIPTION OF THE PREFERRED EMBODIMENT

Figure 1:
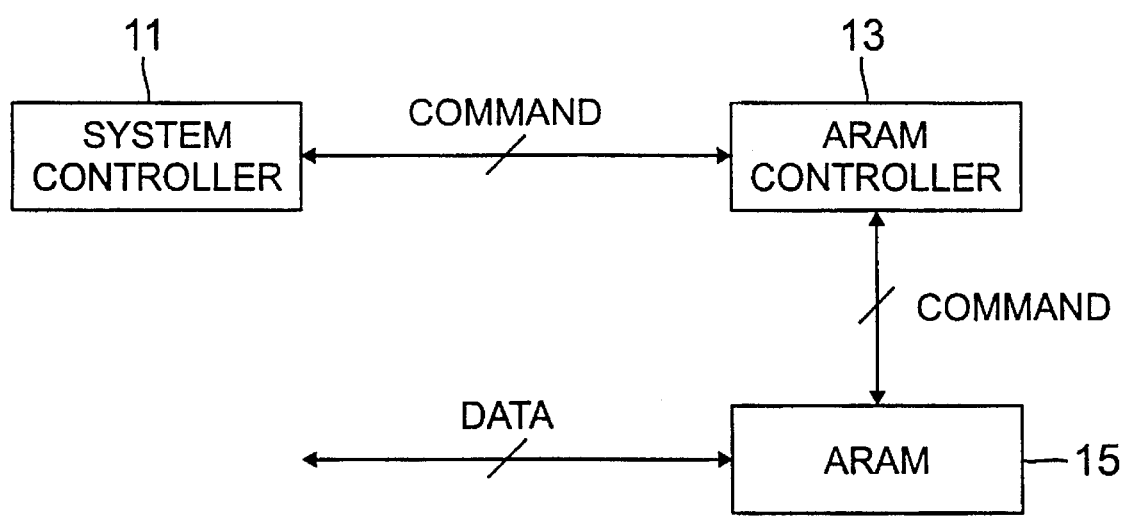
FIG. 1 shows the hardware functional blocks to which the method of the invention is applicable.

Referring to FIG. 1, the associated hardwares of the digital answering machine includes a system controller 11, an ARAM controller 13 and ARAM 15. The system controller 11, which is burned into a firmware implementing the procedures of the invention, executes the formatting operation of the invention and other access operations. The ARAM controller 13, serving as an interface between the system controller 11 and ARAM 15, generates associated signals required to access and refresh the ARAM, /RD, /WR, /RAS and /CAS signals, in a well known manner.

Figure 2:
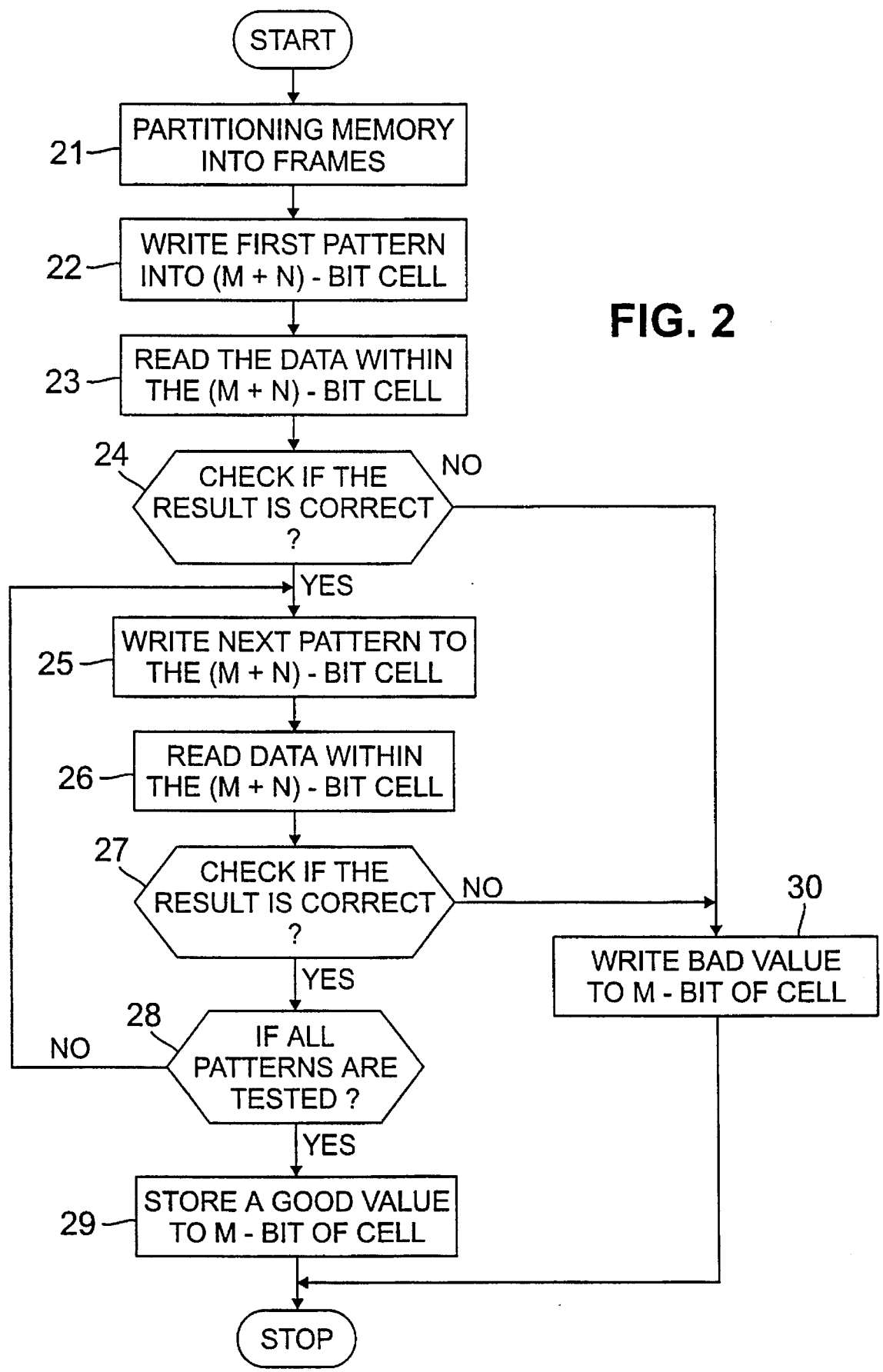
FIG. 2 shows the flow chart of formatting the memory in accordance with the invention.

Referring to a preferred embodiment of the invention outlined in FIG. 2, after the power-on of the system, the method first, in step 21, partitions the memory into a plurality of frames. Each of the plurality of frames has a corresponding N-bit of cell, and M-bit of cell for storing value of an index representative of the defectiveness of the (M+N)-bit of cell. If (M+N)-bit of cell is tested to be good after the write-read test hereinafter described, the N-bit are used to stored the data. Otherwise, the N-bit of cell is disregarded and can not be accessed.

After the step 21, a series of steps which includes step 22, 23, 24 and 25, are provided to perform a write-read access test of a predetermined data pattern to the corresponding (M+N)-bit cell for each frame to determine if any of the (M+N)-bit cell is defective. In details, the step 22 writes a first predetermined pattern of data into the (M+N)-bit cell. The step 23 reads the data within the (M+N)-bit of cell. The step 24 tests if the data read is the same as data write in step 22. To insure the accuracy of the invention, the step 25 further writes a second predetermined pattern of data into the (M+N)-bit cell for same frame again. The step 26 reads the data within the (M+N)-bit of cell. The step 27 tests if the data read is the same as data write in step 25. The step 28 tests if all predetermined data patterns are tested. The procedures continue until all test pattern are completed and go to step 29.

In step 30, the method stores a BAD value of the index into the corresponding M-bit of cell, if the (M+N)-bit cell is tested to be defective in step 24. However, in step 29 the method stores a GOOD value of the index into the corresponding M-bit of cell for the frame, if the (M+N)-bit cell of the frame is good. The shown flow chart is for one frame and the same series of steps are performed for all frames to effectuate the format procedure to cells of entire memory device. It is to be noted, to persons skillful in the arts, reorganization of the disclosed steps are possible which are still within the spirits of the invention.

In practical consideration, the length of N-bit is decided by the data compression/decompression algorithm selected. For instance, when an algorithm which compresses 30 msec voice data into 144 bits is selected, then N equals to 144. Besides, the length of M-bit is decided by the bit length handling capability of the memory processing unit selected and used in the apparatus. For instance, when the memory processing unit handles 4 bits at a time, then M equaling to 4 makes the system more efficient.

Furthermore, the above recited procedure is preferably performed during the power-on initialization period of the system and, accordingly would not place burden on the operations of the system following the initialization.

After the format procedure above recited is performed, access to the memory device in either write or read operation may then be performed in the following way.

Figure 3:
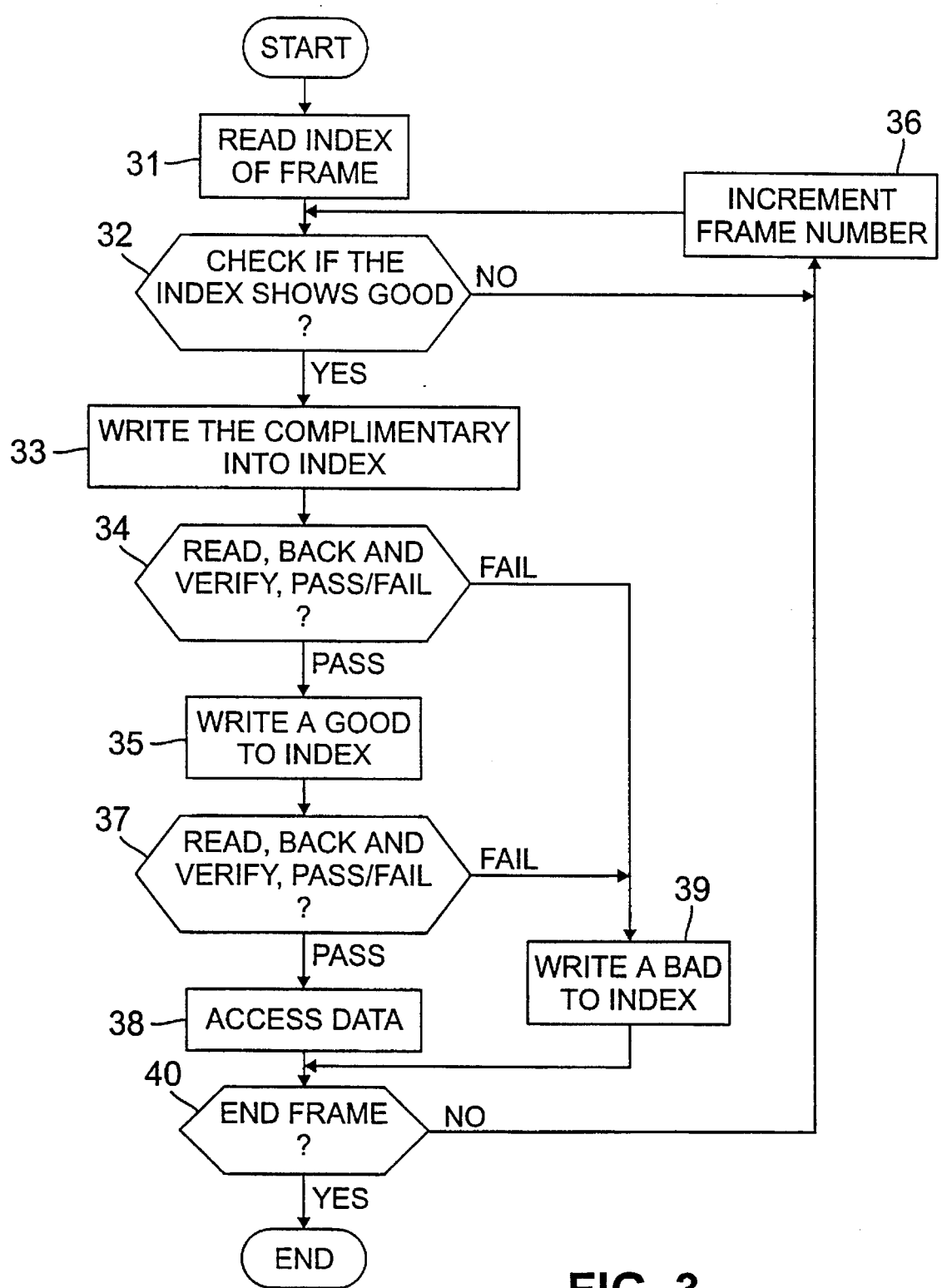
FIG. 3 shows the flow chart of accessing the memory when it is already formatted in accordance with the method depicted in FIG. 2.

Shown in FIG. 3, the access procedures of the method first, in step 31, reads the index of a first frame of the memory to determine whether the corresponding (M+N)-bit cell is good. If the index shows GOOD in step 32, in step 33, write its complementary value into the index. In step 34, test if the complementary value can be read out correctly. In step 35, write the GOOD value into the index again and, in step 37, test if the index is still GOOD. If it is good, in step 38, either read the data stored in the corresponding N-bit of cell, or write the data into the corresponding N-bit of cell. In step 36, increment the frame number, if the step 32 shows a BAD index. If the steps 34 or 37 shows a BAD index, in step 39, write a BAD index into the M-bit of cell and thereafter go to step 40, in which to test if it is an end frame. If not, go to step 36.

In practical implementation, the procedures of the invention is burned into the system controller 11 of the system. The format procedure described is completed during the power-on of the system and would not interfere with the data compression and decompression procedures the system controller 11 needs to perform. It is obvious that, through the implementation of the invention, any kind of ARAM having defective cells at unknown locations may be used in the system and a pre-sorting of the ARAM is no longer necessary.

We claim:

1. A method for accessing a memory having defective cells, the memory being partitioned into a plurality of frames, each of the plurality of frames having a corresponding N-bit of cell, and a M-bit of cell for storing an index representative of the defectiveness of the corresponding (M+N)-bit cell, to each frame of the memory comprising the steps of:

(1) reading the index of a frame of the memory to determine whether the corresponding (M+N)-bit cell is good;

(2) performing a predetermined pattern write-read access test to the corresponding M-bit of cell to determine whether the M-bit of cell is good, if the index shows a GOOD;

(3) reading the data stored in the N-bit of cell, if the result of step (2) is good.

2. The method as recited in claim 1, after step (2) further comprises the step of:

(4) writing a BAD code into the M-bit cell, if the result of step (2) is bad.

3. The method as recited in claim 1, wherein the memory is a Dynamic Random Access memory.

4. The method as recited in claim 3, wherein the memory is used to store audio information.

5. The method as recited in claim 1, wherein the memory is a Static Random Access memory.

6. The method as recited in claim 1, wherein the memory is an EEPROM.

7. The method as recited in claim 1, wherein the memory is a Flash memory.

* * * * *